US012316391B2

(12) United States Patent
Wang et al.

(10) Patent No.: US 12,316,391 B2
(45) Date of Patent: May 27, 2025

(54) PHASED-ARRAY ANTENNA PRECISION SELF-CALIBRATION (71) Applicant: Kyocera International Inc., San Diego, CA (US)

(72) Inventors: James June-Ming Wang, San Diego, CA (US); Yuh-Min Lin, San Diego, CA (US); Powei Chen, San Diego, CA (US)

(73) Assignee: Kyocera International Inc, San diego, CA (US)

( * ) Notice: Subject to any disclaimer, the term of this patent is extended or adjusted under 35 U.S.C. 154(b) by 678 days.

(21) Appl. No.: 17/711,562

(22) Filed: Apr. 1, 2022

(65) Prior Publication Data
US 2023/0095020 A1 Mar. 30, 2023

Related U.S. Application Data (60) Provisional application No. 63/246,221, filed on Sep. 20, 2021.

(51) Int. Cl.
H04B 17/11 (2015.01)
H04B 1/00 (2006.01)
H04B 1/04 (2006.01)
H04B 1/16 (2006.01)
H04B 17/16 (2015.01)
(Continued)

(52) U.S. Cl.
CPC .......... H04B 17/11 (2015.01); H04B 1/0007 (2013.01); H04B 1/04 (2013.01); H04B 1/1607 (2013.01); H04B 17/16 (2015.01); H04B 17/21 (2015.01); H04B 2001/0408 (2013.01); H04B 17/101 (2015.01)

(58) Field of Classification Search
CPC .......... H04B 1/04; H04B 1/0007; H04B 1/16; H04B 1/1607; H04B 17/00; H04B 17/11; H04B 17/12; H04B 17/13; H04B 17/15; H04B 17/16; H04B 17/19; H04B 17/21
See application file for complete search history.

(56) References Cited

U.S. PATENT DOCUMENTS 9,893,820 B2 * 2/2018 Nardozza ............... H04B 17/12
9,991,973 B2 * 6/2018 Sharma .................... H04B 1/40
(Continued)

FOREIGN PATENT DOCUMENTS

WO WO2020-199065 A1 3/2019

OTHER PUBLICATIONS

International Search Report and Written Opinion of International Search Authority for PCT/US2022/023365, dated Jul. 27, 2022 (6 pages).

Primary Examiner — Quochien B Vuong
(74) Attorney, Agent, or Firm — Helen Mao; Zheng Jin; Imperium Patent Works (57) ABSTRACT Radio Frequency (RF) circuit (amplifiers, mixer, etc.) design with RFIC, e.g., implemented in CMOS, CaAs, SiGe, or other silicon processes, suffers performance variations (gain phase, frequency, bandwidth, nonlinearity) due to wafer process variations, temperature changes, and supply voltage changes, and random variations. In this invention, methods are proposed to precisely calibrate the bias current of all active devices in the system, and to precisely calibrate the gain of individual path leading to each amplifiers such that the same Pout is achieved for all antenna elements in the system.

20 Claims, 8 Drawing Sheets (51) Int. Cl.
  *H04B 17/21* (2015.01)
  *H04B 17/10* (2015.01)

(56) References Cited

U.S. PATENT DOCUMENTS

| | | | |
|---|---|---|---|
| 10,469,183 B1* | 11/2019 | Kuo | H04B 17/21 |
| 11,322,837 B2* | 5/2022 | Tiebout | H04B 17/12 |
| 2013/0127545 A1 | 5/2013 | Marra et al. | H03F 3/04 |
| 2018/0131452 A1 | 5/2018 | Sharma | H04B 17/14 |
| 2020/0259462 A1 | 8/2020 | Wu et al. | H03F 1/30 |
| 2021/0116501 A1 | 4/2021 | Martineau et al. | G01R 31/317 |
| 2022/0021363 A1 | 1/2022 | Cui et al. | H03G 1/00 |

* cited by examiner

PHASED-ARRAY ANTENNA PRECISION SELF-CALIBRATION

CROSS REFERENCE TO RELATED APPLICATIONS

This application claims priority under 35 U.S.C. § 119 from U.S. Provisional Application No. 63/246,221, entitled "Phase-Array Antenna Precision Self-Calibration," filed on Sep. 20, 2021, the subject matter of which is incorporated herein by reference.

TECHNICAL FIELD

The disclosed embodiments relate generally to phased-array antenna, and, more particularly, to method of self-calibration for phased-array antenna.

BACKGROUND

In antenna theory, a phased antenna array usually means an array of antennas that creates a beam of radio waves can be electronically steered to point in different directions, without moving the antennas. Beamforming is technique by which an array of antennas can be steered to transmit radio signals in a specific direction. The phase and amplitude of each signal is added constructively and distructively in such a way that they concentrate the energy into a narrow beam or lobe. For multiple array antennas operate in a high-density area, each array antenna has its own beam to point to specific user (direction). For multiple beam array antenna, each antenna beam points to specific direction. The bandwidth shortage increasingly experienced by mobile carriers has motivated the exploration of the underutilized Millimeter Wave (mmWave) frequency spectrum around 24G and 300G Hz for the next generation 5G broadband cellular communication networks. To support directional communications with narrow beams in mmWave networks, a 5G base station supports multiple beam with phased-array antennas.

In a typically phased-array antenna configuration, multiple radio frequency integrated circuits (RFICs), e.g., beamforming RFICs, are used. Each signal path for antenna element contains fixed and variable gain RF amplifiers and phase shifters. To operate a precision phased array function, the amplifier gain and phase shifter going into each antenna elements needs to be precisely controlled. However, RF amplifiers within RFIC are subject to 1) PVT variation (variations in the wafer process, supply voltage, and temperature)—typically results in several dBs of variations if uncompensated; and 2) random variations due to transistor or passive element size variations—this requirement is usually met by limiting the smallest size of transistor, capacitor, resistor to be used within the RFIC. In order to meet the high accuracy requirement (such as 0.375 dB) for amplitude tapering across the antenna array, it is necessary to calibrate RFICs and RF amplifiers across the antenna array.

It is expensive and complicated to calibrate a phased-array antenna system in an over-the-air (OTA) setup for the following reasons: 1) RF Anechoic chamber is required; 2) Far field chamber can significantly speed up the calibration, however, a large array will require a very large antenna chamber; 3) Precision measurements to determine the gain and phase of each individual signal path (corresponding to each antenna element); 4) Large number of states need to be exercise in calibration, i.e., long calibration time, adding to the cost of the system; and 5) Adequate gain adjustment range and gain resolution need to be available for the adjustment and calibration. To reduce the production complexity and post production antenna calibration cost, it is desirable that RFIC is self-calibrated by design for different production or calibrated during the production process by automatic test equipment. It is desirable to have a self-calibration system that does not require an OTA/chamber setup.

SUMMARY

Radio Frequency (RF) circuit (amplifiers, mixer, etc.) design with RFIC, e.g., implemented in CMOS, CaAs, SiGe, or other silicon processes, suffers performance variations (gain phase, frequency, bandwidth, nonlinearity) due to wafer process variations, temperature changes, and supply voltage changes, and random variations. In a phased-array antenna, it is important to maintain near identical performance of each RFIC and each signal path. A phase array antenna over-the-air testing requires expensive antenna chamber and takes a very long time (costly). In this invention, methods are proposed to precisely calibrate the bias current of all active devices in the system, and to precisely calibrate the gain of individual signal path leading to each amplifiers such that the same Pout is achieved for all antenna elements in the system. Note that this type of calibration involves only current measurements and no test instrument and no OTA (over-the-air) testing is used. Therefore, such calibration can be done in the filed or in the factory and significantly reduces the test time in the chamber for mass production.

In one embodiment, a calibration circuit powers off all active circuits and power amplifiers on RFICs of a phased-array antenna. The calibration circuit powers on an active circuit of an RFIC under calibration and monitor a current draw from the active circuit. The calibration circuit measures a bias current of the active circuit and adjusts the bias current to a predefined level during calibration. The calibration circuit repeats the calibration of the bias current for each active circuit of the RFIC and for all the RFICs within the phased-array antenna.

In another embodiment, the calibration circuit powers off all active circuits and power amplifiers on RFICs of a phased-array antenna and powering on a power amplifier and a corresponding signal path leading to the power amplifier of an RFIC under calibration. The calibration circuit provides an input signal having a predetermined signal level and measures a dynamic current of the power amplifier under calibration. The calibration circuit adjusts an amplifier gain and an output power of the corresponding signal path leading to the power amplifier until achieving a desired dynamic current of the power amplifier. The calibration circuit repeats the calibration of the output power for each power amplifier and the corresponding signal path of the RFIC with the same input signal having the pre-determined signal level and for all RFICs within the phased-array antenna.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
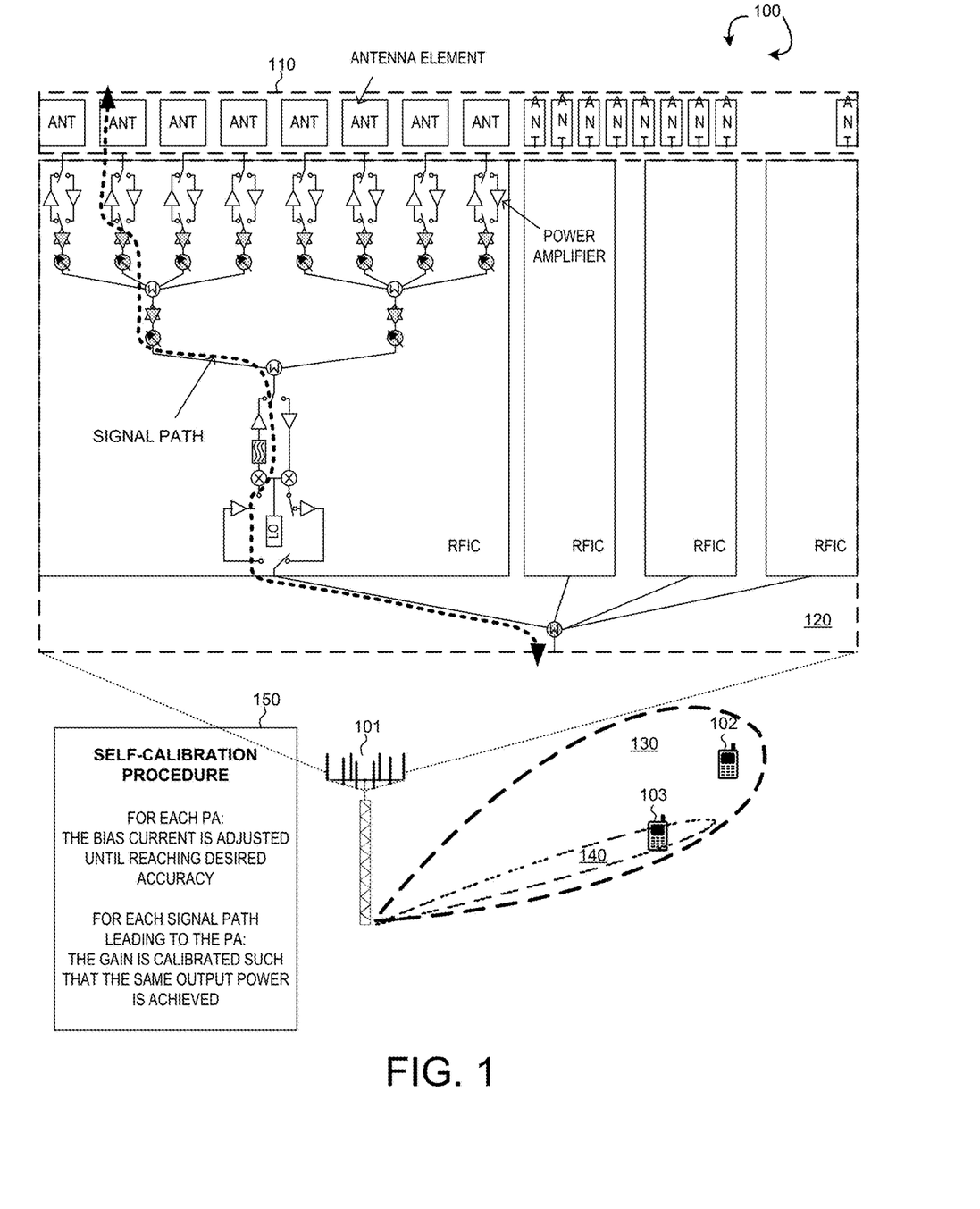
FIG. 1 is a simplified block diagram of a typical transmit phased-array antenna configuration of a base station with self-calibration mechanism in accordance with one novel aspect.

FIG. 1 is a simplified block diagram of a typical transmit phased-array antenna configuration, containing of multiple RFICs distributed across antenna aperture, of a base station 101 with self-calibration mechanism in accordance with one novel aspect. Beamforming cellular mobile communication network 100 comprises a base station BS 101 and a plurality of user equipments including UE 102 and UE 103. The cellular mobile communication network uses directional communications with narrow beams and can support multi-gigabit data rate. One example of such cellular network is a Millimeter Wave (mmWave) network utilizing the mmWave frequency spectrum. In such mmWave network, directional communications are achieved via beamforming, wherein a phased antenna array 110 having multiple antenna elements are applied with multiple sets of beamforming weights (phase shift values) to form multiple beam patterns, which are required to overcome high path loss in the mmWave network and to provide mobility support for mobile terminals. Due to high signal loss in the antenna, package, module, and PCB substrate, it is desirable to place active circuits (power amplifier and low noise amplifiers) in close proximity to the corresponding antenna elements, to reduce the passive loss. This results in a distributed RFIC placement across the antenna aperture with one RFIC serving a few number of antenna elements in its proximity. In the example of FIG. 1, phased antenna array 110 of BS 101 is directionally configured with a set of coarse TX/RX control beams (130) and a set of dedicated TX/RX data beams (140) to serve mobile stations including UE 102 and UE 103.

In the example of FIG. 1, BS 101 comprises phased-array antennas 110 coupled to a combiner splitter network 120. For multiple array antennas operate in a high-density area, each array antenna has its own beam to point to a specific UE (direction). In a typical phased-array antenna configuration, multiple radio frequency integrated circuits (RFICs), e.g., beamforming RFICs, are used. Each RFIC contains multiple signal paths to antenna elements. Each signal path for an antenna element contains fixed and variable gain amplifiers and phase shifters. To operate a precision phased array function, the amplifier gain and phase shifter going into each antenna elements needs to be precisely controlled. However, RF amplifiers within RFIC are subject to 1) PVT variation (variations in the wafer process, supply voltage, and temperature)—typically results in several dBs of variations if uncompensated; and 2) random variations due to transistor or passive element size variations and threshold variations—this requirement is usually met by limiting the smallest size of transistor, capacitor, resistor to be used within the RFIC. In order to meet the high accuracy requirement (such as less than half of 0.375 dB) for amplitude tapering across the antenna array to achieve the desired sibelobe or interference suppression, it is necessary to calibrate the active circuit with the RFICs across the antenna array.

It is expensive and complicated to calibrate a phased-array antenna system in an over-the-air (OTA) setup for the following reasons: 1) RF Anechoic chamber is required; 2) Far field chamber can significantly speed up the calibration, however, a large array will require a very large antenna chamber or a field test range; 3) Precision measurements to determine the gain and phase of each individual signal path (corresponding to each antenna element) at the operating frequency (e.g. mmWave); 4) Large number of states need to be exercise in calibration, i.e., long calibration time, adding to the cost of the system; and 5) Adequate gain adjustment range and gain resolution need to be available for the adjustment and calibration. To reduce the production complexity and post production antenna calibration cost, it is desirable that RFIC is self-compensated by design for different production or calibrated during the production process by a simple automatic test equipment which only requires DC measurements. It is desirable to have a self-calibration system that does not require an OTA/chamber setup.

In accordance with one novel aspect, a procedure for phased-array antenna having RFIC with precision self-calibration is proposed (150). In a first novel aspect, a calibration control procedure is coupled with the calibration circuit, which consists of a controller and a current meter, switches, and bias adjustment circuits, for the bias current in a phased-array antenna is proposed. The bias currents of the active circuits within the system are self-calibrated upon power-up. At the initial stage, all active circuits are turned off. One-by-one, the selected individual active circuit is turned on and its bias current is measured with a current meter within the system. Each active circuit contains a current adjustment circuit (i.e., a current DAC "digital-to-analog converter") for adjusting the bias current of the circuit. The bias current of the selected active circuit can be adjusted via changing the current DAC setting by the controller until reaching the desired accuracy against a pre-defined level for the selected active device. The calibration is repeated until the bias currents of all the active circuits within the system are calibrated. In a second novel aspect, a self-calibration procedure for the output power of each signal path within the phased-array antenna system is proposed. The gain of each individual path is precisely calibrated such that the same output power is achieved for all power amplifiers corresponding to all antenna elements in the system.

Figure 2:
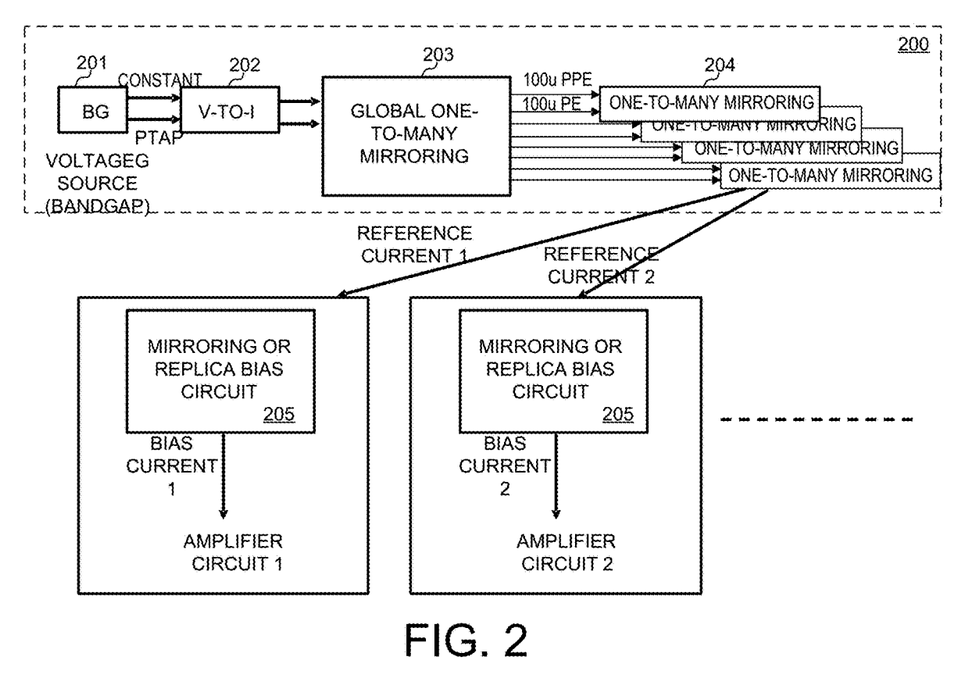
FIG. 2 illustrates an RFIC bias generation system that generates bias current to be used for RF amplifier circuits.

FIG. 2 illustrates an RFIC bias generation system 200 that generates constant bias currents to be used for RF amplifier circuits. The RFIC bias generation system 200 comprises a bandgap (BG) voltage source 201 that provides a constant voltage, which is converted to a constant current (called the global reference current) by V-To-I circuit 202. The global reference current is then used by a global one-to-many mirroring circuit 203 to generate many mirroring currents, e.g., 100 µPPE and 100 µPE, which are used by a plurality of one-to-many mirroring circuits 204, for outputting a plurality of reference currents 1, 2, . . . and so on so forth. The reference currents are in turn provided to generate bias currents to be used for amplifier circuits, via the mirroring or replica bias circuits 205. Each individual circuit has a custom designed mirroring or replica bias circuits to generate the desired bias current in proportional to the reference currents. For example, bias current 1 for active circuit 1, bias current 2 for the active circuit 2, . . . and so on so forth. Ideally, each of the bias currents should have the desired constant bias current level.

The gain of a transistor amplifier is determined by 1) Transistor size and the width versus length (W/L) ratio (subject to the production variations). Percentage of the size variation is reduced if bigger transistor size is used; and 2) The bias current which transistor amplifier is operating at. As illustrated in FIG. 2, in order to achieve the precision bias current at the amplifiers, the RFIC typically implements a bias generation system 200 which consists of 1) Bandgap reference voltage source; 2) Reference voltage to reference current conversion; 3) One-to many reference current mirroring; and 4) Delivery of reference currents to individual amplifiers. At each amplifier, the bias circuit utilize either a mirroring circuit or replica circuit to scale the reference current to the desired operating bias current. One of the major contributors to the errors in bias current mirroring or replica circuit is the Vth threshold voltages, which can have random variations from transistor to transistor. Even if transistor size production variations are acceptable, variations in the Vth threshold voltage can affect the accuracy in the bias current.

Figure 3:
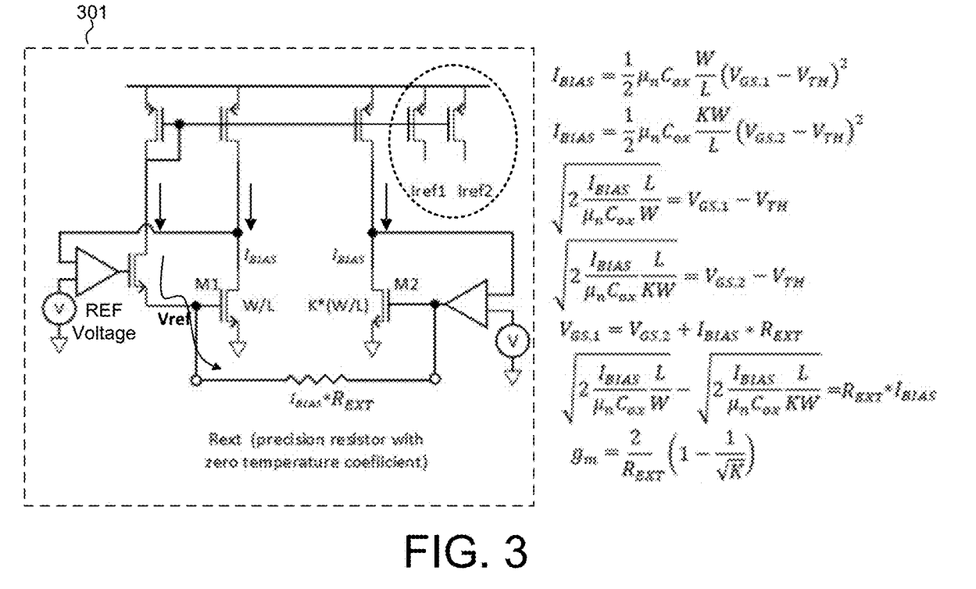
FIG. 3 is a simplified circuit diagram of a bias generator supporting constant gm bias to be used in radio frequency amplifiers in RFIC.

FIG. 3 is a simplified circuit diagram of a bias generator 301 supporting constant gm bias to be used in radio frequency amplifiers in RFIC. Bias generator 301 comprises a pair of transistors M1 and M2, the gate of M1 and M2 are coupled by an external resistor $R_{EXT}$. Transistor M1 has a size of W/L, and transistor M2 has a size of K*(W/L). As depicted in FIG. 3, the constant $G_m$ bias is determined by $R_{EXT}$ and the transistor size radio K only: $g_m=2/R_{EXT}*(1-1/\sqrt{K})$, wherein $R_{EXT}$ is a precision resistor with zero temperature coefficient. Therefore, because the Gm and the reference voltage are PVT independent, then the fixed current generated using these parameters is also PVT independent and hence can be used as a master bias current for a large RFIC. In FIG. 3, Iref1 and Iref2 are different bias current mirrors to be used for different RF amplifiers.

Note that the size ratio K between transistor M1 and transistor M2 is critical for obtaining the precise value of Gm. Additionally, the transistor M1 should replicate the transistor used in the RF amplifiers to maintain good tracking of Gm. It is thus critical to use the same type of transistor and the size. As a result, transistor M2 is formed by replicating K identical transistors M1 having the same size of (W/L). Further, the current density of the transistors should be the same as the current density of the RF amplifier. Therefore, while increasing transistor size can improve the accuracy of the size ratio K, it is not desirable to have a large sized M1 and M2 transistors in order to achieve low power consumption and smaller size of the RFIC.

As explained above, a constant Gm bias is for maintaining the transconductance gain of the amplifier across wafer. A precision and temperature-stable off-chip resistor for each RFIC is used as a reference and the transistor size ratio is used to obtain a precision Gm. However, the accuracy is affected by the variations in the transistor threshold voltage $V_{th}$. In the CMOS semiconductor process, the threshold voltage $V_{th}$ of transistor has high level of variations even within the same wafer. The transistor threshold voltage for M1 is $V_{th,1}$, and the transistor threshold voltage for M2 is $V_{th,2}$. This is the dominant contributor to the error in the bias current of the amplifier generated by the mirroring circuit or replicate bias circuit from the reference current, as illustrated in FIG. 2. The error in the amplifier bias current affect the performance of the amplifier, e.g., Gm~Sgrt Root of Bias Current. Therefore, it is necessary to calibrate the error in the bias current accurately to improve amplifier performance.

In one embodiment, PTAT (proportional to absolute temperature) current sources are used to generate bias currents for active devices in an IC. They are also employed in-bandgap reference circuits which are commonly used to generate temperature independent (or temperature dependent) bias voltages and as reference in measurement systems. The bias current can increase or decrease as a function of temperature, it compensates for the variation in the Gm (Transconductance Gain) of the transistor to maintain its performance over temperature.

Figure 4:
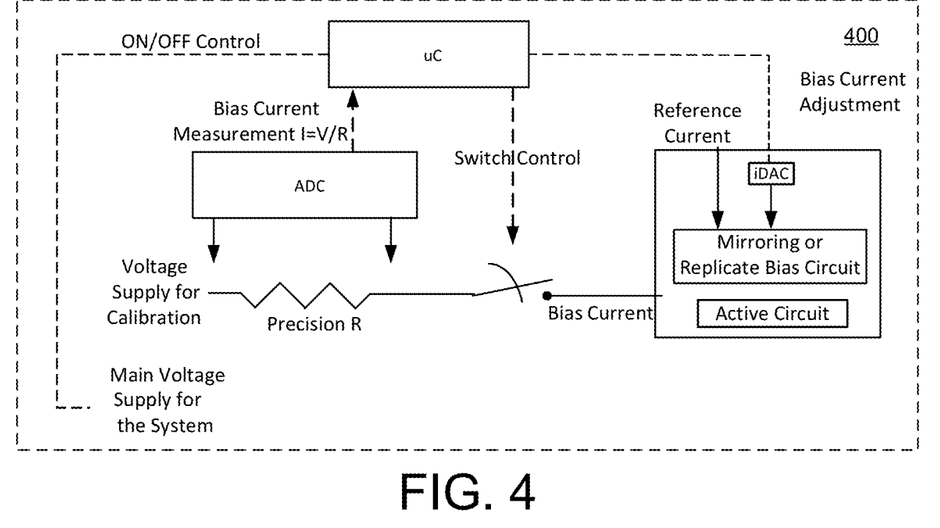
FIG. 4 illustrates one embodiment of a current measuring circuit that can be used for bias current calibration in phased-array antenna.

FIG. 4 illustrates one embodiment of a current measuring circuit (current meter) 400 that can be used as a self-calibrating system for phased-array antennas. A self-calibration system self-calibrates the bias current of power amplifiers in a phased-array antenna upon power up. The self-calibrating system consists of a uC with an analog to digital converter (ADC) which can measure the current, i.e., the voltage drop across a precision resistor R and in addition, the uC controls the circuits turn on and off and the setting of the corresponding bias adjustment for each circuit. The self-calibrating system has the ability to control the bias generation with the RFIC to turn on/off of the bias of each individual circuit, and to turn on/off the main power management system which supply voltage to the RFIC. A separate supply voltage for performing calibration is provided when the main voltage supply for the system is turned off.

Calibration is performed one circuit at a time, i.e., the current to be measured is low to allow precision current (i.e., the voltage drop of the current across a precision resistor) measurement by the ADC (typically within the uC). Each circuit contains a current DAC which injects a correction current into the mirroring or replicate bias circuit for the circuit to adjust the bias circuit under the control of the uC. The key reason to employs a separate supply voltage for performing calibration is to avoid this precision resistor in the path of main power supply which can consume unnecessary power during operation (after calibration is complete). The RFIC can adjust the bias current during calibration until it reaches the pre-defined level with an acceptable tolerance.

In the example of FIG. 4, the current measuring circuit 400 comprises µC, ADC, iDAC, and Precision R. The µC measures current I by using ADC to measure voltage V across a precision resistor R, e.g., I=V/R. To avoid precision resistor R dissipates power during regular operation, the main voltage supply for the system is turned off and an auxiliary voltage supply for calibration is switched on during measurement. The uC adjust the current Digital to analog converter (iDAC) until the desired bias current is measured. For example, a 4 to 6-bit control signal can be used to adjust the iDAC until achieving the desired bias current. Note that each amplifier or active circuit within the system can be turned on and off under uC control. This measurement is repeated for each active circuit within the system while all the other circuits are turned off.

Figure 5:
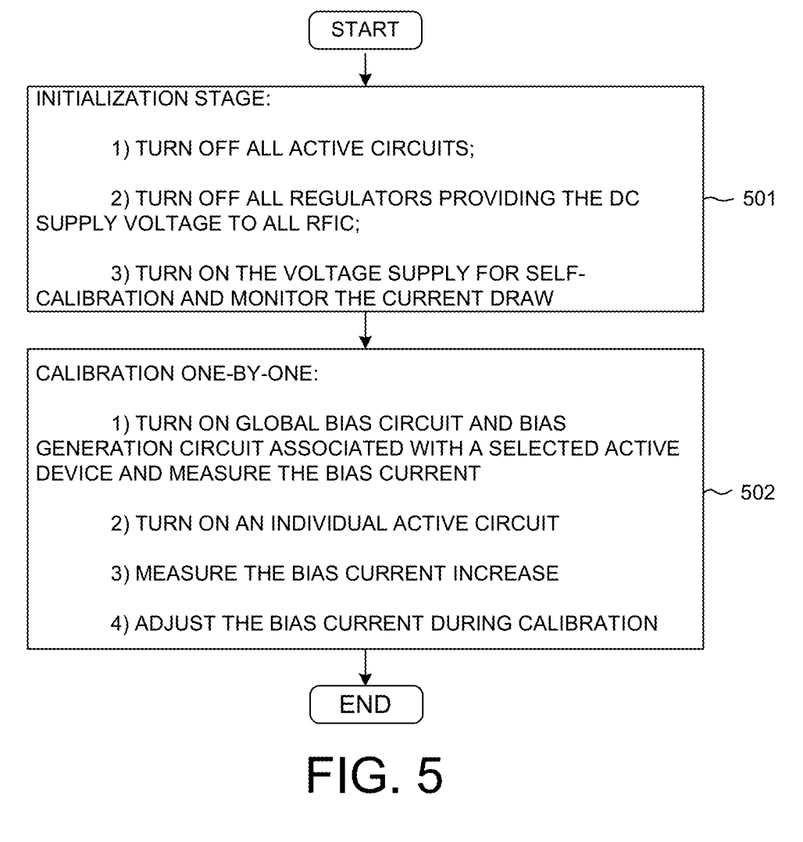
FIG. 5 is a flow chart of a procedure for self-calibrating bias current in phased-array antenna in accordance with one novel aspect.

FIG. 5 is a flow chart of a procedure for self-calibrating bias current of power amplifiers in a phased-array antenna in accordance with one novel aspect. Step 501 is the initialization stage, where the following actions are performed by a self-calibration system: 1) turn off all amplifier circuits; 2) turn off all regulators providing the DC supply voltages to all RFICs; In step 502, one by one, the self-calibration system turns on the individual power amplifier and measures the bias current: 1) turn on the voltage supply for self-calibration, Global Bias Generator and the bias generator associated with a selected circuit, measure the current, 2) turn on the selected active circuit, 3) monitor the increased current draw of the selected circuit, and 4) the self-calibration system adjusts the bias current (via changing the setting of the iDAC) of each active device until it reaches the desired accuracy.

Figure 6:
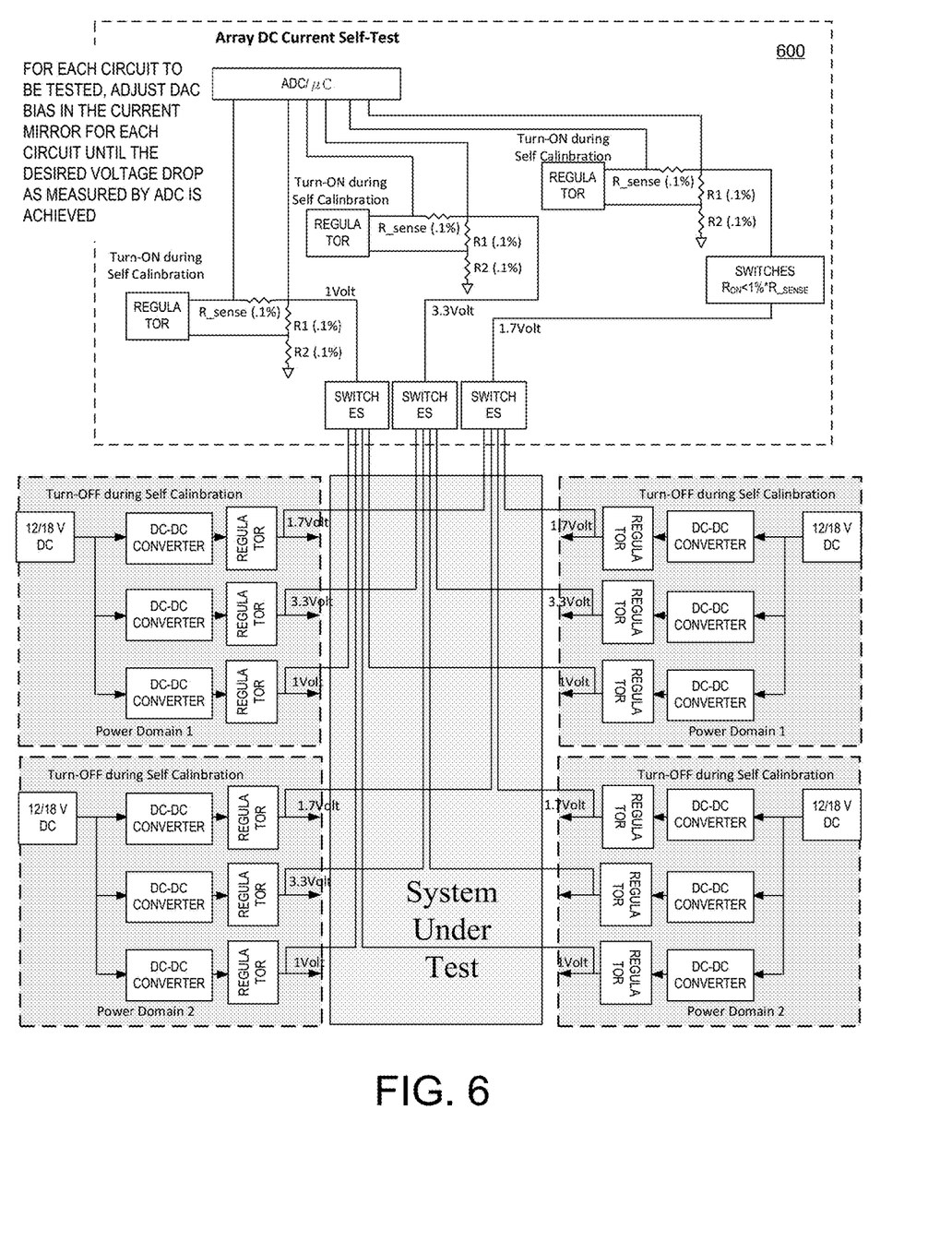
FIG. 6 illustrates one embodiment of a bias current self-calibration system for phased-array antenna in accordance with one novel aspect.

FIG. 6 illustrates one embodiment of a bias current self-calibration system 600 for phased-array antenna in accordance with one novel aspect. The self-calibration system 600 is similar to the current measuring circuit 400, but is implemented with additional regulators and switches for calibrating circuits (system under test) that have three different supply voltages for operation and divided into four power supply domains. The different supply voltages, 1 volt, 1.7 volt, and 3.3 volt, can be calibrated separately, e.g., controlled by the regulators and switches; the four power supply domains can also be calibrated separately to reduce power consumption, e.g., controlled by the regulators and switches, and the calibration is repeated in each power supply domain. This allows low cost commercial off-the-shelf power supply to be used. During calibration, all circuits are turned off except one circuit to be tested. For each circuit, adjust DAC bias in the current mirror until the desired voltage drop as measured by the ADC is achieved.

Note the self-calibration is performed in foreground, meaning the phased-array antenna system is not in normal operating state. The self-calibration can be performed at initial power-up or during the system idle or maintenance time. The self-calibration achieves the precise bias current for the amplifiers, which means that precise amplifier gain can be achieved as well. The self-calibration system reduces cost because it does not require using OTA chamber setup.

In 3GPP or IEEE wireless systems, high order modulation scheme such as OFDM with 64 QAM, 256 QAM or 1024 QAM are used. This type of modulation requires the power amplifier to operate at linear region to avoid high EVM (error vector magnitude). In a phased-array antenna, it is desirable to monitor the output power from the IC going into each antenna element, for the purpose of creating precise antenna pattern, and for avoiding power amplifier nonlinearity (driving the PA at the proper backoff). Since an input signal can go through many stages of active devices before reach the power amplifier, each stage of an device contributes some error in the amplifier gain. It is thus desirable to measure the output power and adjust the gain to maintain the signal level at the proper power amplifier operation point.

Figure 7:
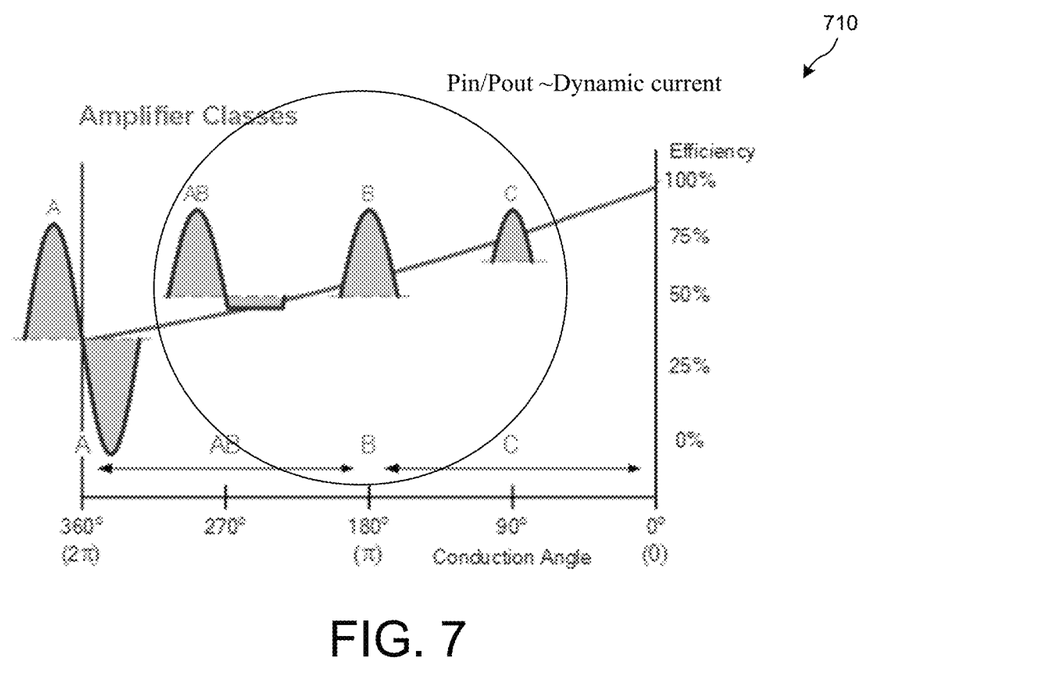
FIG. 7 illustrates different power amplifier classes and the dynamic current at proper backoff operating point of a power amplifier.

FIG. 7 illustrates different power amplifier classes and the dynamic current at proper backoff operating point of a power amplifier. Note that the average power consumption of the power amplifier (if it is not class A amplifier) depends on its operating level (signal level). When there is no input signal, there power amplifier will have quiescent current. When the input signal increases, the bias current of PA also increases. Dynamic current is the average operating bias current subtract the quiescent current. As illustrated in FIG. 7, small signal does not trigger current conduction, and higher signal creates high current conduction duty cycle.

The proposed invention is to implement the power detector based on measurement of the dynamic current of the PA at the proper backoff operating point of the PA. In the preferred embodiment of a CMOS Class A-B PA, it is found that back-offing about 6 or 7 dB from output power P1 dB, the dynamic current accurately reflect output power level regardless of semiconductor process corners and temperatures.

Figure 8:
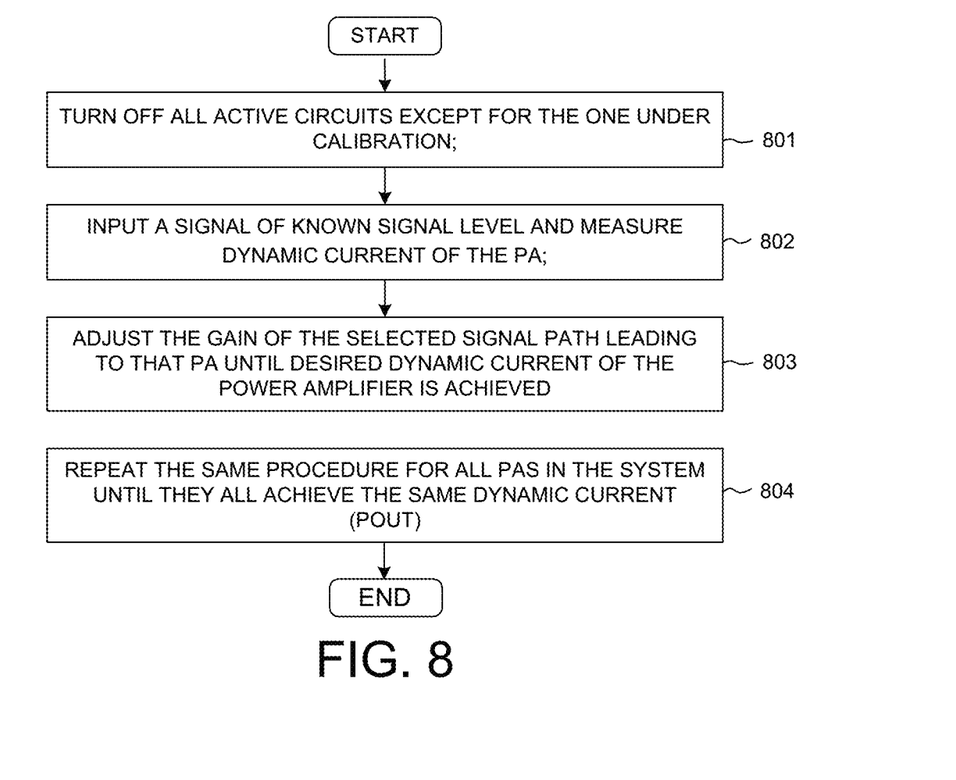
FIG. 8 is a flow chart of a procedure for self-calibrating output power in phased-array antenna in accordance with one novel aspect.

FIG. 8 is a flow chart of a procedure for self-calibrating output power in phased-array antenna in accordance with one novel aspect. For output power measurement, the same bias current measuring system as illustrated earlier is applied for measuring the dynamic current. In step 801, turned off all active circuits except for the active circuits in the select signal paths under calibration. In step 802, input a signal of known signal level and measuring dynamic current of PA. Note that the input signal is typically CW (Continuous wave) and the input signal level is selected at the pre-defined output power level corresponding to the most accurate dynamic current (i.e., least amount of dynamic variations due to process, supply voltage changes. First measuring the quiescent current while input is off and then measure bias current when input signal is on to derive the dynamic current (i.e., the operating bias current with input signal minus the quiescent current). In step 803, adjust the amplifier gain of the selected signal path leading to that power amplifier until desired dynamic current of the PA is achieved. Compensate error $\Delta G$ by adjusting the variable gain amplifier in each path. In step 804, repeat the same procedure to all the power amplifiers in all the signal paths within the system until all PAs achieve the same dynamic current (Pout).

Figure 9:
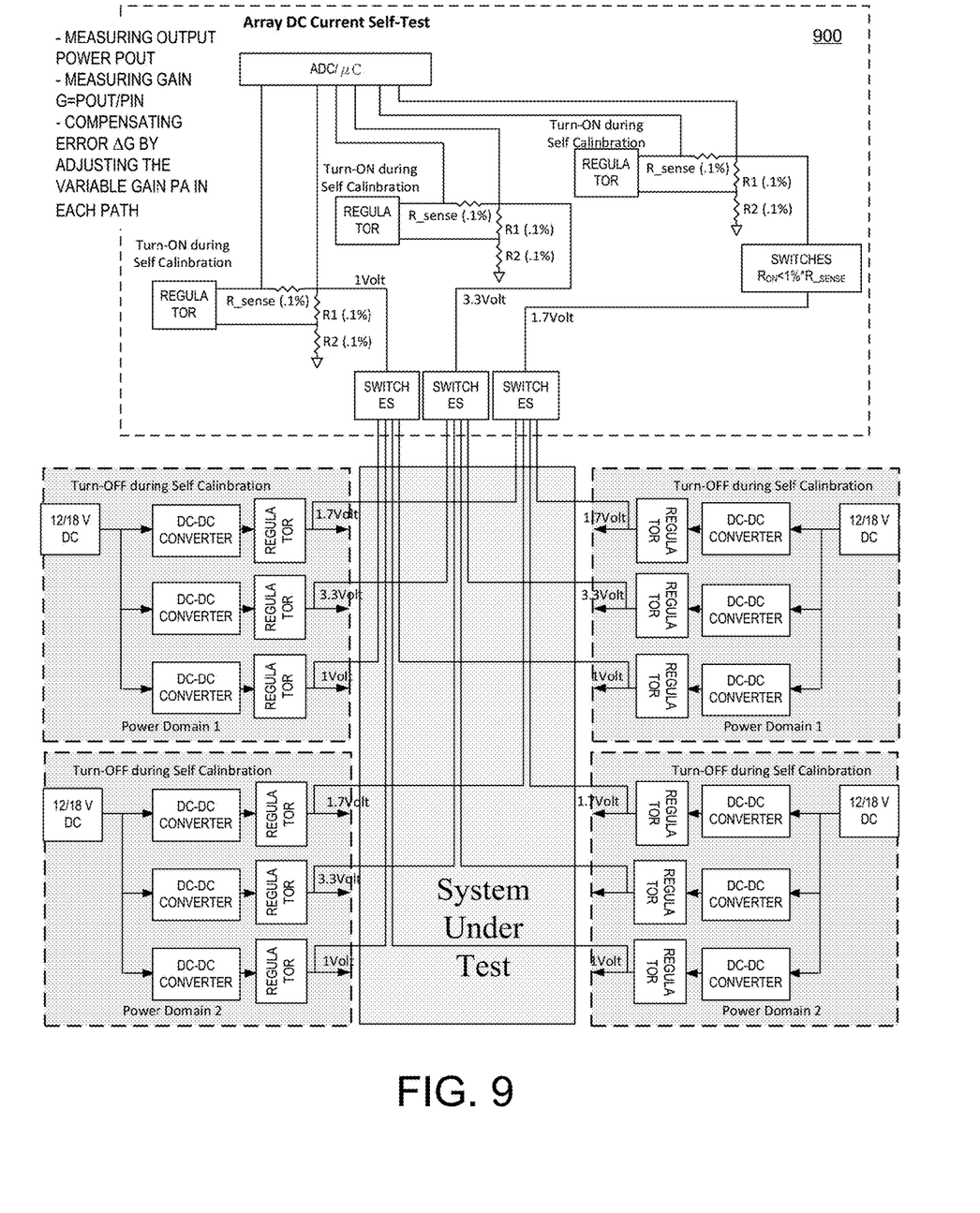
FIG. 9 illustrates one embodiment of output power self-calibration system for phased-array antenna in accordance with one novel aspect.

FIG. 9 illustrates one embodiment of output power self-calibration system 900 for phased-array antenna in accordance with one novel aspect. The output power self-calibration system 900 is similar to the bias current self-calibration system 600 illustrated in FIG. 6, and is implemented with additional regulators and switches for calibrating circuits (system under test) that have three different supply voltages for operation and divided into four power domains. The different supply voltages, 1 volt, 1.7 volt, and 3.3 volt, can be calibrated separately, e.g., controlled by the regulators and switches; the four power domains can also be calibrated separately to reduce power consumption, e.g., controlled by the regulators and switches. During calibration, all circuits are turned off except one circuit to be tested. For each circuit, 1) measure the output power Pout; 2) measure the gain G=Pout/Pin; 3) compensate error $\Delta G$ by adjusting the variable gain of the power amplifier of the selected path, until the desired dynamic current of the power amplifier is achieved.

Whole signal chain calibration can be done by monitor the 1.7 v PA dynamic current. Because the gain/power is flatter at the center frequency, to minimize gain/power sensitivity to process and temperature, all stages need to be tuned to the correct center frequency. Frequency tuning step need to be fine enough to limit the error to less than ½ LSB of 0.375 dB. Calibration can be carryout by first fine tune the center frequency of all stages to the desire frequency, then adjust the gain to reach the desire 1.7 v PA dynamic current. To conclude, above 6 dbm, the error is less than ½ LSB of 0.375 dBm over process corner. The error over temperature (30 C to 80 C) is more than 1.5 LSB and come from center frequency shift due to temperature. The error may be smaller if operate at center frequency. Re-simulation over temperature at corresponding center frequency verifies that sensitivity of temperature can be reduced to an acceptable level by operating only at center frequency. The calibration procedure can be performed at different signal frequencies and the calibrated setting can be stored in the uC which can be loaded depending on which signal frequency is selected.

Figure 10:
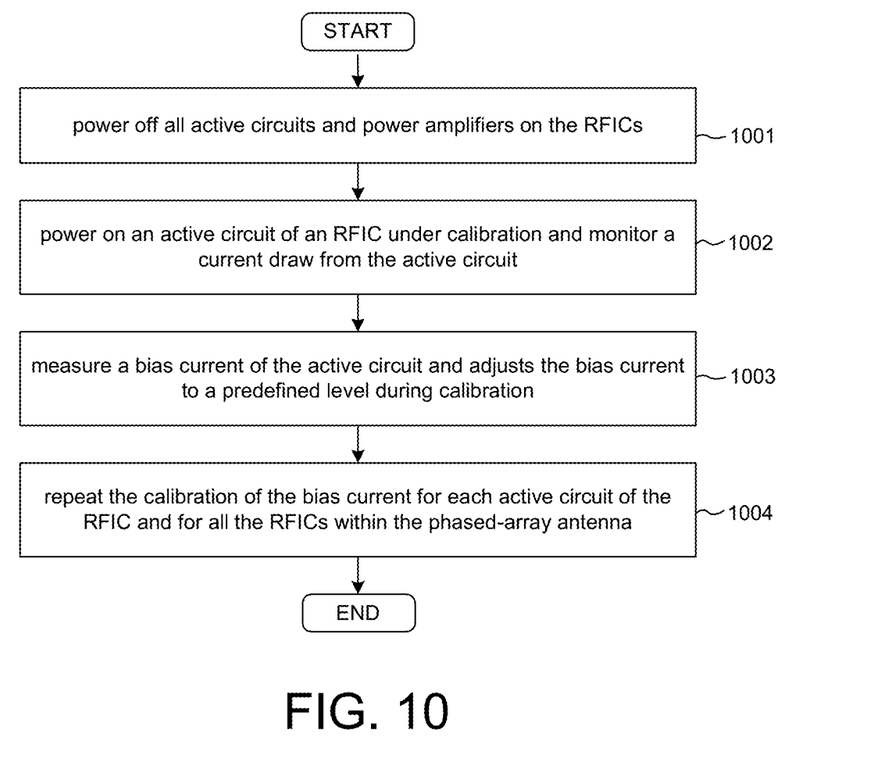
FIG. 10 is a flow chart of a method for self-calibrating bias currents of active circuits on RFICs of a phased-array antenna in accordance with one novel aspect.

FIG. 10 is a flow chart of a method for self-calibrating bias currents of active circuits on RFICs of a phased-array antenna in accordance with one novel aspect. In step 1001, a calibration circuit powers off all active circuits and power amplifiers on the RFICs. In step 1002, the calibration circuit powers on an active circuit of an RFIC under calibration and monitor a current draw from the active circuit. In step 1003, the calibration circuit measures a bias current of the active circuit and adjusts the bias current to a predefined level during calibration. In step 1004, the calibration circuit repeats the calibration of the bias current for each active circuit of the RFIC and for all the RFICs within the phased-array antenna.

Figure 11:
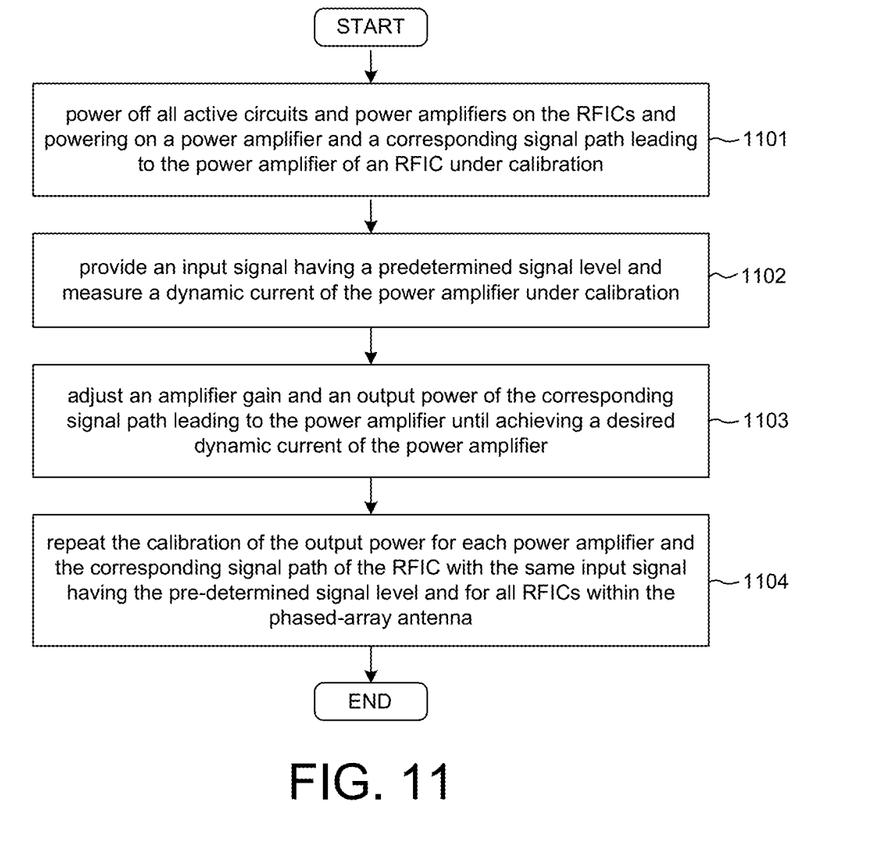
FIG. 11 is a flow chart of a method for self-calibrating output powers of power amplifiers on RFICs of a phased-array antenna in accordance with one novel aspect.

FIG. 11 is a flow chart of a method for self-calibrating output powers of power amplifiers on RFICs of a phased-array antenna in accordance with one novel aspect. In step 1101, the calibration circuit powers off all active circuits and power amplifiers on the RFICs and powering on a power amplifier and a corresponding signal path leading to the power amplifier of an RFIC under calibration. In step 1102, the calibration circuit provides an input signal having a predetermined signal level and measures a dynamic current of the power amplifier under calibration. In step 1103, the calibration circuit adjusts an amplifier gain and an output power of the corresponding signal path leading to the power amplifier until achieving a desired dynamic current of the power amplifier. In step 1104, the calibration circuit repeats the calibration of the output power for each power amplifier and the corresponding signal path of the RFIC with the same input signal having the pre-determined signal level and for all RFICs within the phased-array antenna.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A method of self-calibration for radio frequency integrated circuits (RFICs) within a phased-array antenna, comprising:
    powering off all active circuits and power amplifiers on the RFICs;
    powering on an active circuit of an RFIC under calibration and monitor a current draw from the active circuit;
    measuring a bias current of the active circuit and adjusting the bias current to a predefined level during calibration;
    repeating the calibration of the bias current for each active circuit of the RFIC and for all the RFICs within the phased-array antenna.

2. The method of claim 1, wherein the bias current is measured by a μC using an analog-to-digital converter (ADC) to measure a voltage across a precision resistor R.

3. The method of claim 2, wherein the μC adjusts a current digital-to-analog converter (DAC) until achieving a desired bias current.

4. The method of claim 1, wherein each active circuit within the RFIC can be turned on or off under the μC control.

5. The method of claim 1, wherein a main voltage supply is turned off and an auxiliary voltage supply is turned on during the bias current measurement.

6. A method of self-calibration for radio frequency integrated circuits (RFICs) within a phased-array antenna, comprising:
    powering off all active circuits and power amplifiers on the RFICs and powering on a power amplifier and a corresponding signal path leading to the power amplifier of an RFIC under calibration;
    inputting an input signal having a pre-determined signal level and measuring a dynamic current of the power amplifier under calibration;
    adjusting an amplifier gain and an output power of the corresponding signal path leading to the power amplifier until achieving a desired dynamic current of the power amplifier; and
    repeating the calibration of the output power for each power amplifier and the corresponding signal path of the RFIC with the same input signal having the pre-determined signal level and for all RFICs within the phased-array antenna.

7. The method of claim 6, wherein the measuring of the dynamic current of the power amplifier involves measuring a quiescent current while the input signal is off and then measuring the bias current when the input signal is on.

8. The method of claim 7, wherein the dynamic current is equal to an average bias current subtract the quiescent current.

9. The method of claim 6, wherein the dynamic current is measured at a pre-determined backoff operating point of the power amplifier corresponding to high accuracy.

10. The method of claim 9, wherein the desired dynamic current reflects the output power level at the pre-determined backoff operating point.

11. A phased-array antenna comprising a plurality of radio frequency integrated circuits (RFICs), wherein each RFIC comprises:
    a plurality of active circuits and powering power amplifiers that are powered off initially, wherein an active circuit of an RFIC under calibration is powered on;
    a measuring circuit comprising a μC that monitors a current draw from the active circuit, wherein the μC measures a bias current of the active circuit and adjusts the bias current during calibration; and
    a plurality of regulators and switches that repeats the calibration of the bias current for each active circuit of the RFIC.

12. The phased-array antenna of claim 11, wherein the μC measures the bias current using an analog-to-digital converter (ADC) to measure a voltage across a precision resistor R.

13. The phased-array antenna of claim 12, wherein the μC adjusts a current digital-to-analog converter (DAC) until achieving a desired bias current.

14. The phased-array antenna of claim 11, wherein each active circuit within the RFIC can be turned on or off under the μC control.

15. The phased-array antenna of claim 11, wherein a main voltage supply is turned off and an auxiliary voltage supply is turned on during the bias current measurement.

16. The phased-array antenna of claim 11, wherein each RFIC further comprises:
- an input node that receives an input signal having a pre-determined signal level, wherein a dynamic current of a power amplifier of the RFIC under calibration is measured; and
- an output node that outputs an output power of a selected signal path leading to the power amplifier, wherein the output power is adjusted by adjusting a gain in the selected signal path until a desired dynamic current is achieved, wherein the calibration of the output power is repeated for each power amplifier of the RFIC.

17. The phased-array antenna of claim 16, wherein the measuring of the dynamic current of the power amplifier involves measuring a quiescent current while the input signal is off and then measuring the bias current when the input signal is on.

18. The phased-array antenna of claim 17, wherein the dynamic current is equal to an average bias current subtract the quiescent current.

19. The phased-array antenna of claim 16, wherein the dynamic current is measured at a backoff operating point of the power amplifier.

20. The phased-array antenna of claim 19, wherein the desired dynamic current reflects the output power level at the backoff operating point.

\* \* \* \* \*